(12) United States Patent
Niclass et al.

(10) Patent No.: US 9,257,589 B2
(45) Date of Patent: Feb. 9, 2016

(54) SINGLE PHOTON AVALANCHE DIODE WITH SECOND SEMICONDUCTOR LAYER BURRIED IN EPITAXIAL LAYER

(71) Applicant: KABUSHIKI KAISHA TOYOTA CHUO KENKYUSHO, Nagakute-shi, Aichi-ken (JP)

(72) Inventors: Cristiano Niclass, Nagakute (JP); Mineki Soga, Nagakute (JP)

(73) Assignee: KABUSHIKI KAISHA TOYOTA CHUO KENKYUSHO, Nagakute-shi (JP)

( * ) Notice: Subject to any disclaimer, the term of this patent is extended or adjusted under 35 U.S.C. 154(b) by 0 days.

(21) Appl. No.: 14/465,340

(22) Filed: Aug. 21, 2014

(65) Prior Publication Data

US 2015/0054111 A1 Feb. 26, 2015

(30) Foreign Application Priority Data

Aug. 23, 2013 (JP) ................. 2013-173592

(51) Int. Cl.
*H01L 27/14* (2006.01)
*H01L 31/107* (2006.01)
*H01L 27/144* (2006.01)

(52) U.S. Cl.
CPC .......... *H01L 31/107* (2013.01); *H01L 27/1446* (2013.01)

(58) Field of Classification Search
CPC ................... H01L 27/1446; H01L 31/107
See application file for complete search history.

(56) References Cited

U.S. PATENT DOCUMENTS

| 8,093,624 B1 | 1/2012 | Renzi et al. |
| 8,259,293 B2 | 9/2012 | Andreou et al. |
| 2010/0133636 A1 | 6/2010 | Richardson et al. |
| 2010/0159632 A1 | 6/2010 | Rhodes et al. |
| 2014/0103196 A1 | 4/2014 | SOGA et al. |

FOREIGN PATENT DOCUMENTS

| EP | 2 455 984 A2 | 5/2012 |
| JP | A-9-232621 | 9/1997 |
| JP | A-2004-319576 | 11/2004 |
| JP | A-2008-103614 | 5/2008 |
| JP | B2-4131191 | 8/2008 |
| JP | A-2012-60012 | 3/2012 |
| WO | WO 2008/011617 A2 | 1/2008 |
| WO | WO 2012/032353 A2 | 3/2012 |

*Primary Examiner* — Thanh V Pham
(74) *Attorney, Agent, or Firm* — Oliff PLC

(57) ABSTRACT

A first semiconductor layer serves as a first implanted layer of a first conductivity type. A second semiconductor layer of a second conductivity type is provided under the first semiconductor layer. The second conductivity type is opposite to the first conductivity type. The second semiconductor layer is buried in an epitaxial layer grown above a substrate. The second semiconductor layer becomes fully depleted when an appropriate bias voltage is applied to the device.

19 Claims, 6 Drawing Sheets

US 9,257,589 B2

SINGLE PHOTON AVALANCHE DIODE WITH SECOND SEMICONDUCTOR LAYER BURRIED IN EPITAXIAL LAYER

PRIORITY INFORMATION

This application claims priority to Japanese Patent Application No. 2013-173592, filed on Aug. 23, 2013, which is incorporated herein by reference in its entirety.

BACKGROUND OF THE INVENTION

1. Field of the Invention

The present invention relates to a single photon avalanche diode.

2. Description of the Related Art

An avalanche photodiode can be operated differently according to a selected mode. When the selected mode is Geiger mode, the avalanche photodiode operates under a reverse bias voltage higher than its breakdown voltage. When the selected mode is linear mode, the avalanche photodiode operates under a reverse bias voltage lower than the breakdown voltage. The avalanche photodiode operating in the Geiger mode is referred to as a single photon avalanche diode (SPAD), which is superior in some characteristics to the avalanche photodiode operating in the linear mode. The SPAD is capable of generating an electric signal in response to an input of very small optical power, such as a single photon, and can be employed as a device dedicated to detecting the single photon. Further, the SPAD has a higher time resolution (approximately several ten ps) that is sufficiently responsive to detect an optical event with high precision. The above-mentioned advantageous characteristics are suitable to realize time measurement for a weak optical signal, such as in the so-called time of flight (TOF) principle.

A large-scale array structure, such as an image sensor, can be realized by implementing the SPAD using a semiconductor integration technology, such as a CMOS process technology. A large-scale array structure including several tens of thousands of SPADs disposed in a two-dimensional pattern has recently become available.

However, the aperture ratio of a SPAD array is small compared to that of a two-dimensional array structure of a conventional diode. The aperture ratio is the ratio of the light sensitive area to the entire area of the pixel.

FIG. 10 illustrates a cross-sectional structure of a conventional SPAD that can be realized using a CMOS process technology. A first semiconductor layer 101 is an implanted layer positioned on a second semiconductor layer 102 of opposite-conductivity type. The first and second semiconductor layers form a p-n junction 110. The second semiconductor layer 102 is an epitaxial layer formed on a substrate 108 of an integrated circuit, or on another implant layer or substrate. A separation layer 103 is an implanted layer that surrounds each SPAD in such a way as to separate the SPAD from a neighboring SPAD and circuit elements in the lateral direction. The separation layer 103 is of opposite conductivity type to the first semiconductor layer 101. The p-n junction includes electrodes 104 and 105. A depletion layer 106 is formed in the SPAD when a reverse bias is applied to the p-n junction.

To use the SPAD as a single photon detector, it is necessary to form a high electric field area 107 of approximately $3\times10^5$ V/cm, which should be uniformly formed to have a planar structure that underlies the first semiconductor layer. More specifically, it is necessary to form an avalanche multiplication area. When carriers generated by the photoelectric effect reach the avalanche multiplication area, the carriers are multiplied while they repetitively cause impact ionizations. The multiplication speed is faster than the charging speed of the junction capacitance of the SPAD. Therefore, the junction capacitance of the SPAD can be completely discharged. In other words, incident light can be extracted as a large signal without requiring external amplification.

A major challenge in designing the SPAD is the difficulty of forming the high electric field area (more specifically, the avalanche multiplication area) having a highly uniform planar structure under severe variability of the employed semiconductor manufacturing process. In general, a junction surface has a smaller curvature radius (i.e., an acute angle) at an edge 114 of the p-n junction 110. Therefore, the electric field becomes stronger in that location. If the formed electric field is locally uneven, a breakdown will be induced at the higher electric field portion. A conventionally known SPAD array has a guard-ring structure, which surrounds the avalanche multiplication area in such a way as to prevent the breakdown at the edge thereof. Although the guard-ring structure can be modified in various ways, the guard-ring structure has a role of forming a low electric field area that surrounds the avalanche multiplication area. Therefore, a sufficiently large electric field difference can be maintained between the planar avalanche multiplication area 107 and the guard-ring (edge layer) 114. Thus, the SPAD can realize highly reliable operations even in a case where a semiconductor layer has properties that vary depending on the employed process.

The electric field in the guard-ring 114 is not sufficiently strong to induce avalanche multiplication. Therefore, carriers having reached the guard-ring 114 or carriers generated in the guard-ring 114 do not repetitively cause impact ionizations and cannot be detected in the Geiger mode. If the relationship between the magnitude of the electric field and the width of the depletion layer in the p-n junction is taken into consideration, the lateral width 112 of the depletion layer in the guard-ring 114 is larger than the vertical thickness 111 of the depletion layer at a central region of the SPAD. However, similar to time characteristics in photon detection, the vertical thickness ill of the depletion layer has a significant influence on the efficiency in the detection performed by the SPAD.

It is desired for carriers to be generated when light is absorbed at depletion layer wherein the avalanche multiplication occurs, because such primary carriers can generate a SPAD output signal with a higher time resolution. If carriers are generated when light is absorbed in quasi-neutral regions located above and/or beneath the depletion layer, the generated carriers slowly diffuse and may reach the depletion layer without causing any recombination. In this case, the carriers can generate an output signal, although the time resolution is lower. Such a low time resolution will deteriorate performance when high time resolution is required in the application (e.g., TOF).

The number of carriers per unit of depth generated in a silicon substrate reduces exponentially when the depth increases. The reduction speed depends on a wavelength-dependent light absorption coefficient. The long-wavelength light can penetrate deeply before it is completely absorbed, because the long-wavelength light has a lower absorption coefficient. To absorb and detect incident light having a longer wavelength comparable to the near infrared ray as much as possible, it is desired for the vertical thickness 111 of the depletion layer to beset as larger as possible.

The sensitivity of the conventional SPAD is dissatisfactory in the near infrared region. The sensitivity depends not only on the aperture ratio but also on the photon detection efficiency. According to the conventional guard-ring structure, if the vertical thickness 111 of the depletion layer is increased, the lateral width 112 of the depletion layer increases correspondingly. This leads to a reduction in the aperture ratio. Therefore, according to the conventional SPAD, the aperture ratio and the photon detection efficiency are in a trade-off relationship.

A guard-ring structure capable of increasing the aperture ratio is proposed in the prior art. The proposed guard-ring structure has a shallow trench isolation (STI) structure as a guard-ring and is usable in a conventional CMOS technology. The STI structure can substantially limit the size of the light-insensitive boundary of the avalanche multiplication area. It is expected that the small width of the STI can realize a higher aperture ratio, because this process specification is optimized. However, the above-mentioned technique is defective in the following two points. First, the crystal defect density is high at the interface region between the silicon and the STI. Therefore, it is conventionally known that this interface region has a high density of traps and recombination centers with a broad energy distribution. Accordingly, it is necessary to separate the interface region from the high electric field area. In the STI guard-ring approach, the interface region is in contact with the avalanche multiplication area. Therefore, the STI/silicon interface tends to cause false counts, i.e. dark counts. In practice, a dark count rate of about 1 MHz occurs. Further, the STI employed in the CMOS technology is mainly used to separate low-voltage transistors. The depth of the STI is extremely small (e.g., a few hundred nm). Accordingly, unless the process is customized, the STI cannot be used to limit the boundary of a SPAD having a depletion layer whose depth exceeds several hundred nm.

Further, there is a conventional SPAD having another structure. The structure is based on a backside illumination (BSI) technology to bond a wafer of a thinned SPAD array with another wafer including an interface circuit to realize a SPAD having a high aperture ratio. The structure is characterized by a buried layer having a continuous stepped structure. The stepped structure enhances the electric field in the SPAD and forms a planar avalanche multiplication area. The electric field formed by the stepped structure is a drift field. Light can be absorbed over a wide region larger than the high electric field region. Generated carriers can be collected by the drift field. However, the buried layer having the above-mentioned structure cannot be realized by the CMOS process. Therefore, a specialized apparatus and processes are required to form the above-mentioned stepped layer.

Further there is a conventional technique capable of increasing the aperture ratio of the SPAD. When the aperture ratio becomes lower, light detection efficiency decreases correspondingly. Therefore, the conventional technique uses a microlens array to converge incident light to the avalanche multiplication area in such a way as to increase the detection efficiency. However, the use of the microlens array is not effective in many low-light applications, because those applications require an optical system having a small F-number. Further, customization of the CMOS process is required to manufacture the microlens array. Therefore, manufacturing costs increase. Further, the size of a microlens required for the SPAD is greater than the size (typically less than 10 μm) of a microlens that can be formed using the present CMOS technology. Therefore, realizing such a large and thick microlens further increases manufacturing costs.

The present invention is directed to a technique capable of solving the trade-off relationship between the aperture ratio and the photon detection efficiency and intends to provide a SPAD that has excellent time responsiveness for long wavelength light comparable to the near infrared range. In particular, the present invention provides a SPAD to which a general semiconductor manufacturing method, such as a CMOS process, is applicable and can reduce manufacturing costs.

SUMMARY OF THE INVENTION

According to an aspect of the present invention, a single photon avalanche photodiode (SPAD) includes a first semiconductor layer of a first conductivity type, a second semiconductor layer of a second conductivity type provided under the first semiconductor layer, in which the second conductivity type is opposite to the first conductivity type, and a third semiconductor layer of the second conductivity type, which surrounds the first semiconductor layer. The SPAD further includes an epitaxial layer of the second conductivity type, which is formed on a substrate, a first contact connected to the first semiconductor layer via a conducting layer of the first conductivity type, and a second contact connected to the second semiconductor layer via a conducting layer of the second conductivity type. The second semiconductor layer is buried in the epitaxial layer. The second semiconductor layer can be completely depleted of carriers when an appropriate bias voltage is applied between the first contact and the second contact. Therefore, the junction between the first semiconductor layer and the second semiconductor layer forms a planar avalanche multiplication area that is substantially parallel to the surface of the substrate. The lateral width of the depletion layer between the first semiconductor layer and the third semiconductor layer becomes smaller than the vertical width of the depletion layer between the first semiconductor layer and the epitaxial layer. Because the lateral width of the depletion layer is small, the distance between neighboring SPADs can be reduced, and the aperture ratio can be increased. The photon detection efficiency can be increased because the width of the depletion layer in the depth direction is large.

BRIEF DESCRIPTION OF THE DRAWINGS

Preferred embodiments of the present invention will be described in detail by reference to the following drawings, wherein.

DESCRIPTION OF THE PREFERRED EMBODIMENTS

First Embodiment

Figure 1:
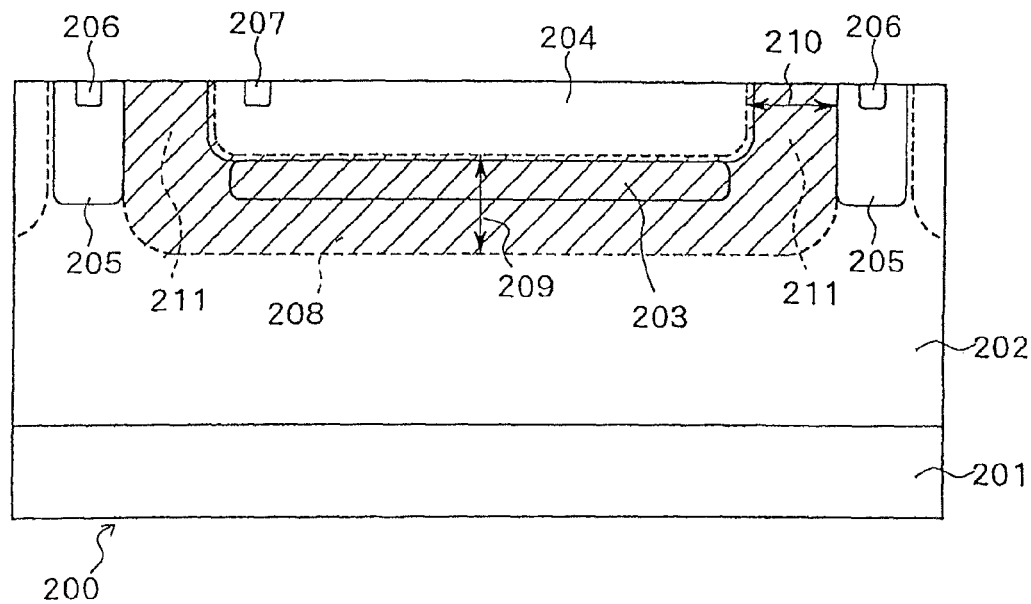
FIG. 1 is a cross-sectional view schematically illustrating a structure of the SPAD according to a first embodiment.

FIG. 1 is a cross-sectional view illustrating a SPAD according to a first embodiment of the present invention. The SPAD according to the present embodiment includes a second semiconductor layer 203 that is buried within an epitaxial layer 202 and of the same conductivity type as the epitaxial layer 202. Further, the SPAD illustrated in FIG. 1 includes a first semiconductor layer 204 that is implanted above the second semiconductor layer 203 and is of the opposite conductivity type to the epitaxial layer 202. The epitaxial layer 202 is a layer that has grown on a silicon substrate 201. The silicon substrate 201 is of the same type as the epitaxial layer 202. It is preferred that the second semiconductor layer 203, the epitaxial layer 202, and the silicon substrate 201 be of p-type conductivity. On the other hand, it is preferred that the first semiconductor layer 204 be of n-type conductivity. The SPAD formed by the first semiconductor layer 204 and the second semiconductor layer 203 is surrounded by a third semiconductor layer 205 and it is therefore separated from a neighboring SPAD. The third semiconductor layer 205 is of the same conductivity type as the second semiconductor layer 203. In other words, the third semiconductor layer 205 is preferably of p-type conductivity. The first semiconductor layer 204 is directly connected to an electrode or contact 207 preferably via a highly doped diffusion conductive path or via any conductive path. The second semiconductor layer 203 is electrically connected to a contact 206 formed on the third semiconductor layer 205 via the epitaxial layer 202 (i.e., a conductive path) and/or to a contact positioned at a bottom portion of a chip 200 and formed below the substrate 201, which is generally a low resistive material.

The depletion region 208 completely encloses the second semiconductor layer 203 and determines operational characteristics of the SPAD. It is preferred to optimize doping profiles of the first semiconductor layer 204 and the second semiconductor layer 203 in such a manner that the second semiconductor layer 203 can become fully depleted of carriers when a bias voltage nearly equal to or exceeding the breakdown voltage is applied to the SPAD.

Figure 2:
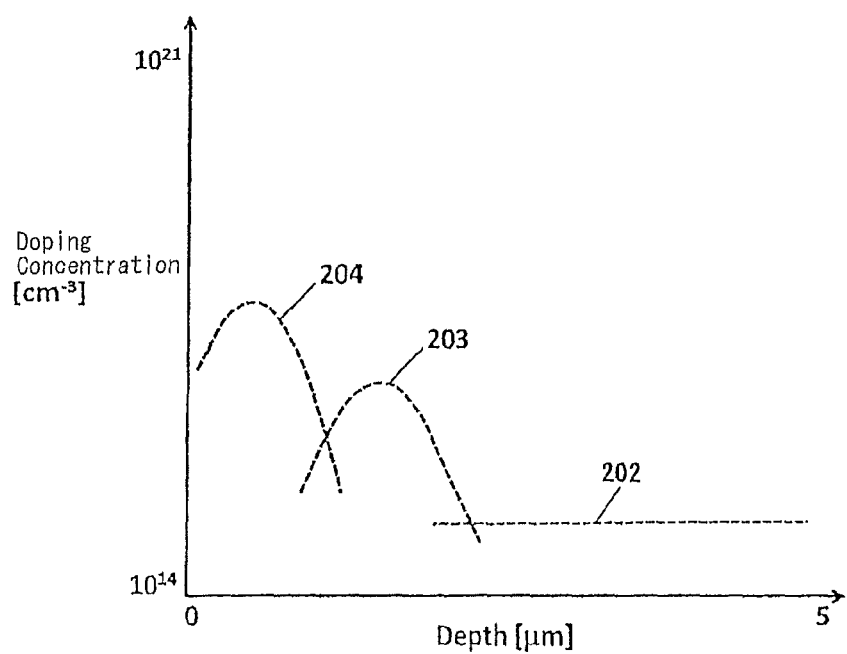
FIG. 2 illustrates a doping profile of the SPAD, in the depth direction, according to the first embodiment.

FIG. 2 illustrates an example of the doping profile of the SPAD according to the present embodiment. A peak value of the doping concentration of the second semiconductor layer 203 is set to be higher than a peak value of the doping concentration of the epitaxial layer 202. Further, a peak value of the doping concentration of the first semiconductor layer 204 is set to be higher than a peak value of the doping concentration of the second semiconductor layer 203. However, the peak value of the doping concentration of the first semiconductor layer 204 may become lower than the peak value of the doping concentration of the second semiconductor layer 203, depending on the shape of the doping profile of the first semiconductor layer 204 or the shape of the doping profile of the second semiconductor layer 203. In particular, it is necessary to set the peak value of the doping concentration of the second semiconductor layer 203 to be higher when the doping profile of the second semiconductor layer 203 is smaller in thickness.

If a reverse bias voltage is applied to the SPAD having the above-mentioned doping profile, the second semiconductor layer 203 becomes fully depleted and a very strong electric field is generated in the depletion layer area due to the space charge of the depleted layer. The generated electric field is stronger, in particular, near the junction area between the first semiconductor layer 204 and the second semiconductor layer 203, where compared to the electric field of other regions of the depletion layer. For example, the electric field in the order of $3\times10^5$ V/cm can be generated.

Further, if the doping concentration of the epitaxial layer 202 is relatively low, e.g., in a range from $10^{14}/cm^3$ to $10^{15}/cm^3$, the width 209 of the depletion layer 208 in the depth direction can be enlarged in the downward direction. The width 209 in the depth direction becomes greater than a width 210 in the lateral direction. In this case, the lateral width 210 of the depletion layer 208 tends to become greater than that illustrated in FIG. 1. However, in the embodiment of the present invention, the lateral width 210 can be reduced by adjusting the distance between the third semiconductor layer 205 and the first semiconductor layer 204 in such a way as to set the maximum electric field in an area 211 of the depletion layer extending in the lateral direction to be lower than the planar electric field in the avalanche multiplication area in the second semiconductor layer 203.

A photon absorbed at the bottom of the depletion layer or in the vicinity thereof can induce an avalanche breakdown and therefore can be efficiently detected. In particular, when the optical signal has a long wavelength comparable to the near infrared region, the photon detection efficiency can be increased because the depth 209 of the depletion layer 208 is enlarged. On the other hand, a photon absorbed in the area 211 of the depletion layer 208 extending in the lateral direction cannot induce a perfect avalanche breakdown and therefore cannot be detected. Accordingly, when the aperture ratio of the SPAD is required to be high, it is necessary to limit the lateral width 210 of the depletion layer in such a way as to reduce the resulting insensitive area.

Figure 3:
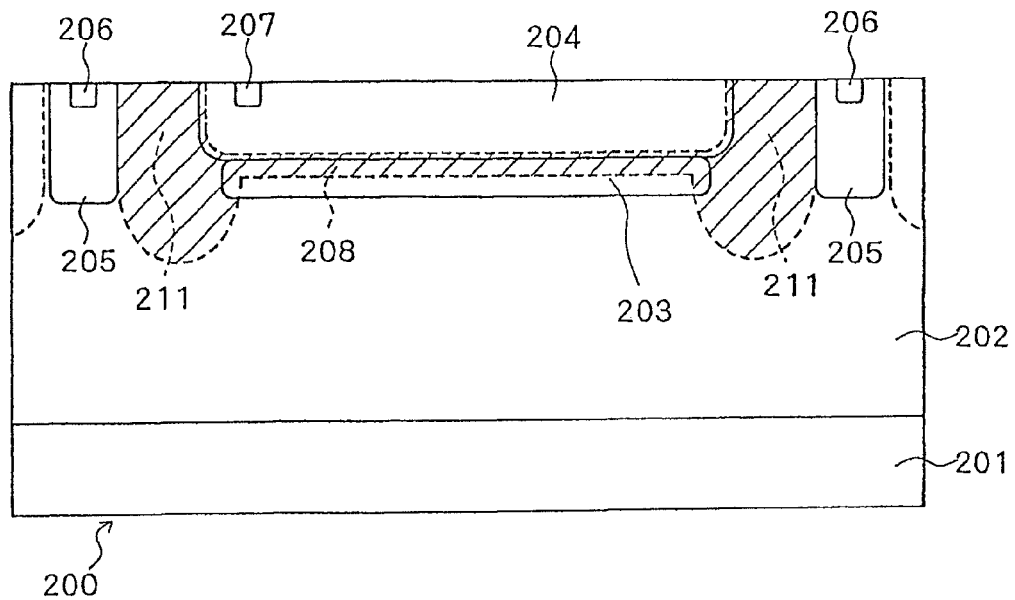
FIG. 3 is a cross-sectional view schematically illustrating a depletion layer that may be formed when the doping profile is inappropriate.

As a comparative example, FIG. 3 illustrates a depletion layer that may be formed when the doping profiles of the first semiconductor layer 204 and the second semiconductor layer 203 are inappropriately set. When a reverse bias voltage equal to or exceeding the breakdown voltage is applied to the SPAD, the second semiconductor layer 203 cannot be fully depleted. In this case, different from the embodiment of the present invention illustrated in FIG. 1, the width of the depletion layer in the depth direction between the first semiconductor layer 204 and the second semiconductor layer 203 is smaller than the lateral width of the depletion layer between the first semiconductor layer 204 and the third semiconductor layer 205. The SPAD illustrated in FIG. 3 cannot bring about the above-mentioned advantageous characteristics described in the first embodiment of the present invention and has drawbacks similar to those of the conventional techniques.

If no appropriate layer is available for the SPAD in the CMOS process to be used, customizing the CMOS process may be required to optimize the first semiconductor layer 204 and the second semiconductor layer 203 of the SPAD according to the present embodiment. However, the manufacturing costs do not increase so greatly, because of the availability of existing equipment in manufacturing facilities of CMOS integrated circuits.

In general, the number of photomasks required in the present CMOS process is 20 to 30. It is believed that the increase in manufacturing costs to realize the present invention will be sufficiently small if the number of photomasks additionally required for the formation of the first semiconductor layer 204 and the second semiconductor layer 203 can be limited to two or fewer. Ideally the number of additionally required photomasks is zero.

Further, the present CMOS process generally employs an ion implantation process to form a desired doping profile on a silicon wafer, rather than employing a diffusion process.

The ion implantation is advantageous in that layer characteristics can be demarcated in detail and the doping profile can be adequately controlled in both the lateral and the vertical directions. The first semiconductor layer 204 and the second semiconductor layer 203 can be formed using the ion implantation process that is generally employed in the present CMOS technology. Further, if necessary, the first semiconductor layer 204 and the second semiconductor layer 203 can be processed without changing the thermal budget in a CMOS process. Therefore, it is feasible to maintain the compatibility with most of CMOS processes. More specifically, it is possible to design and manufacture the SPAD according to the embodiment of the present invention using only the existing layers in CMOS. In many cases, it is preferred to customize at least one layer among the first semiconductor layer 204 and the second semiconductor layer 203.

Second Embodiment

Figure 4:
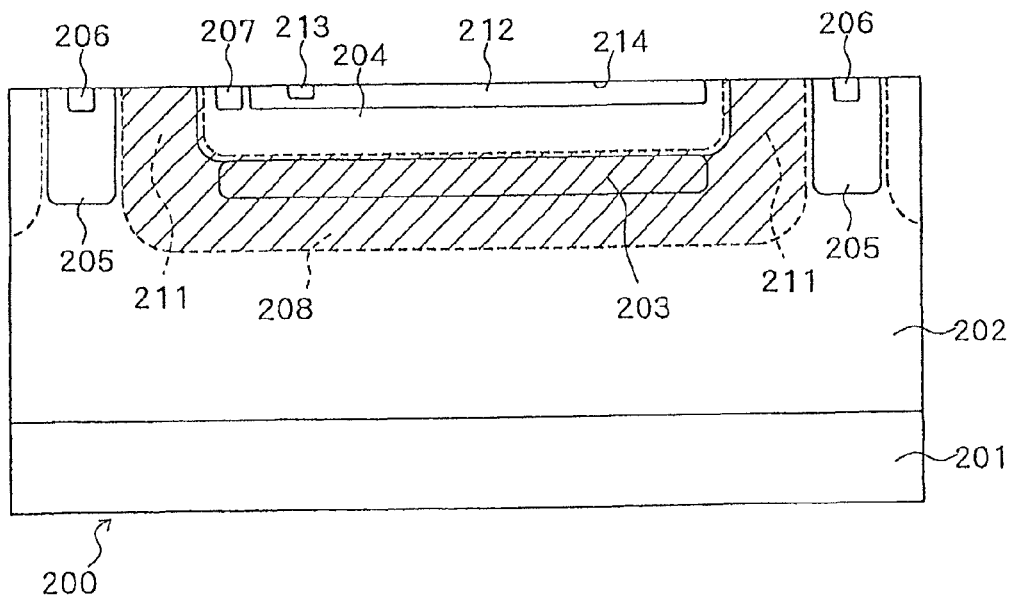
FIG. 4 is a cross-sectional view schematically illustrating a structure of the SPAD according to a second embodiment.

FIG. 4 illustrates a SPAD configuration according to a second embodiment of the present invention. According to the SPAD configuration illustrated in FIG. 4, all of the second semiconductor layer 203, the third semiconductor layer 205, the epitaxial layer 202, and the substrate 201 are of p-type conductivity and the first semiconductor layer 204 is of n-type conductivity. In the present embodiment, a fourth semiconductor layer 212 is formed within the first semiconductor layer 204 of the SPAD. The fourth semiconductor layer 212 is shallow in shape and is of p-type conductivity. The fourth semiconductor layer 212 is formed in such a way as to sufficiently overlap the avalanche multiplication area formed between the first semiconductor layer 204 and the second semiconductor layer 203. At least one electrode 213 may be provided to connect the fourth semiconductor layer 212.

Figure 5:
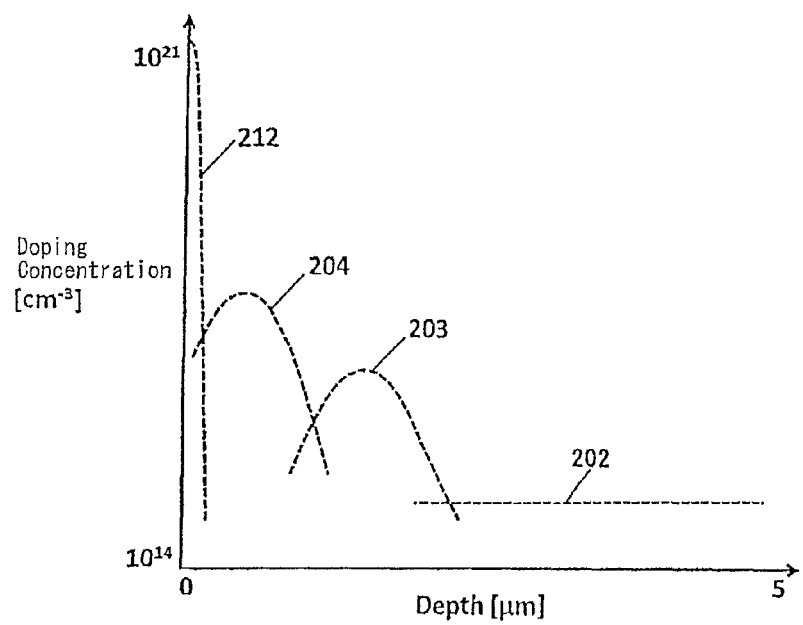
FIG. 5 illustrates a doping profile of the SPAD, in the depth direction, according to the second embodiment.

FIG. 5 illustrates an example of the doping profile of the SPAD according to the present embodiment. As illustrated in FIG. 5, a peak value of the doping concentration of the fourth semiconductor layer 212 is set to be higher than a peak value of the doping concentration of the first semiconductor layer 204. Further, the fourth semiconductor layer 212 is formed in a thin, shallow area positioned above the first semiconductor layer 204.

At an interface 214 between monocrystalline silicon and a silicon oxide film having grown thereon, an electrostatic potential field is formed in the depth direction, depending on the type of implanted impurity due to segregation effects. An n-type impurity (e.g., arsenic or phosphorus) generates an electric field that induces a carrier drift occurring from the silicon surface towards a deeper portion of a device. On the other hand, a high-density of carrier generation/recombination center is present at a silicon/oxide interface. Therefore, thermally generated carriers may reach the avalanche multiplication area of the SPAD, thus increasing the dark count rate, i.e. its main source of noise.

The function of the fourth semiconductor layer 212 is to isolate the SPAD avalanche multiplication area from the above-mentioned undesirably generated carriers so that noise characteristics of the device can be improved. It is preferred that the bias voltage applied to the fourth semiconductor layer 212 via the electrode 213 be made the same as the bias of the first semiconductor layer 204, for example, by short-circuiting the contact 207 and the electrode 213. Alternatively, a relative bias between the fourth semiconductor layer 212 and the first semiconductor layer 204 can be statically or dynamically modulated in such a way as to intentionally control the shape and the thickness of the depletion layer formed between these layers. For example, it is possible to increase or decrease the capability of collecting minority carriers in the vicinity of a junction portion thereof.

The present embodiment is not limited to the above-mentioned examples. For example, the presence of the fourth semiconductor layer 212 is potentially not required when the first semiconductor layer 204 is completely or partially buried in the epitaxial layer 202.

Third Embodiment

Figure 6:
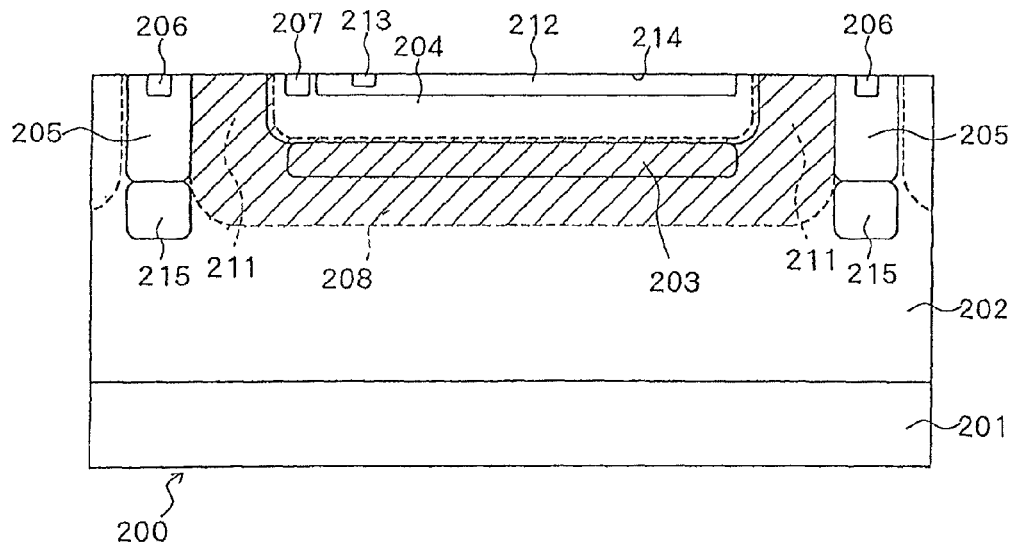
FIG. 6 is a cross-sectional view schematically illustrating a structure of the SPAD according to a third embodiment.

FIG. 6 illustrates a SPAD configuration according to a third embodiment of the present invention. The SPAD illustrated in FIG. 6 is characteristically similar to the SPADs described in the above-mentioned embodiments.

In the present embodiment, the isolation of neighboring SPADs is implemented by a combination of the third semiconductor layer 205 and a buried isolation layer 215, instead of using only the third semiconductor layer 205. The third semiconductor layer 205 and the buried isolation layer 215 are of the same conductivity type and are stacked in the vertical direction. It is desired that the third semiconductor layer 205 and the buried isolation layer 215 are of p-type conductivity. The vertically stacked layers 205 and 215 can effectively prevent the depletion layer 208 of one SPAD from contacting the depletion layer 208 of a neighboring SPAD. In other words, the SPAD illustrated in FIG. 6 can improve the isolation between neighboring SPADs.

Layers usable in the present CMOS process or any arbitrary combination thereof can be utilized to form the third semiconductor layer 205 and the buried isolation layer 215. For example, a p-well layer can be utilized to form the third semiconductor layer 205. A p+ layer can be utilized to form the contact 206. A deep-p-well layer can be utilized to form the buried isolation layer 215. Further, it is useful to form the buried isolation layer 215 and the second semiconductor layer 203 by the same ion implantation process. Alternatively, it is useful to form the buried isolation layer 215 by any arbitrary stacking combination of a standard p-well layer and a deep-p-well layer.

If desired, the fourth semiconductor layer 212 and the electrode 213 can be removed from the configuration illustrated in FIG. 6. If the fourth semiconductor layer 212 and the electrode 213 are removed, the remaining configuration becomes similar to the configuration described in the first embodiment except for the isolation layer configuration between neighboring SPADs. In a case where the fourth semiconductor layer 212 and the electrode 213 are present, the SPAD configuration illustrated in FIG. 6 is similar to the SPAD configuration illustrated in FIG. 4 except for the isolation layer configuration between neighboring SPADs.

Fourth Embodiment

Figure 7:
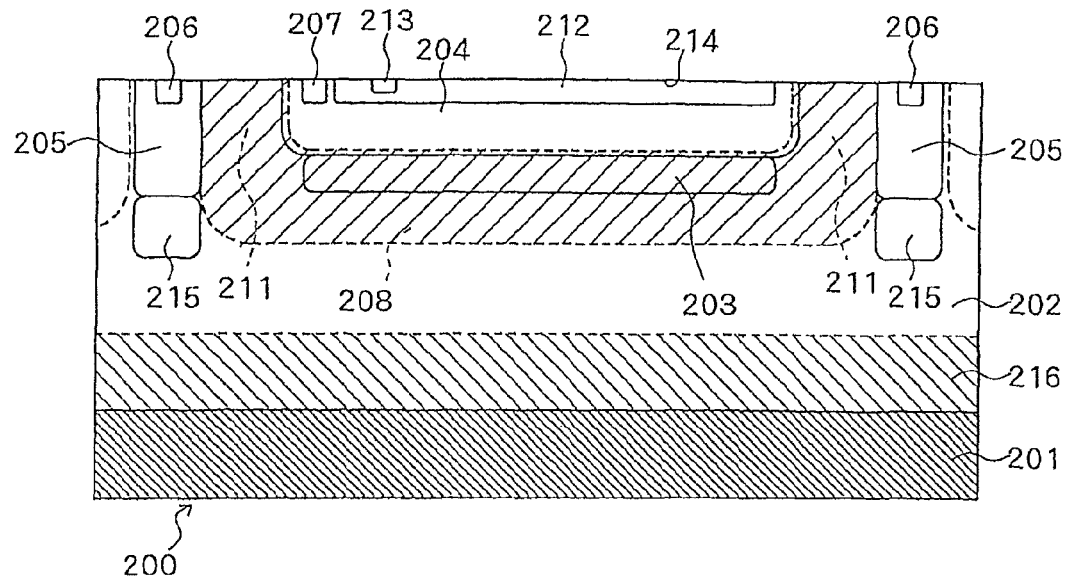
FIG. 7 is a cross-sectional view schematically illustrating a structure of the SPAD according to a fourth embodiment.

FIG. 7 illustrates a SPAD configuration according to a fourth embodiment of the present invention, in which the doping concentration of the epitaxial layer 202 is characterized by a gradient profile. The SPAD illustrated in FIG. 7 includes many constituent components that are similar to those described in the third embodiment. In other words, the SPAD according to the present embodiment has advantageous characteristics that can be brought about by the above-mentioned similar configuration.

Figure 8:
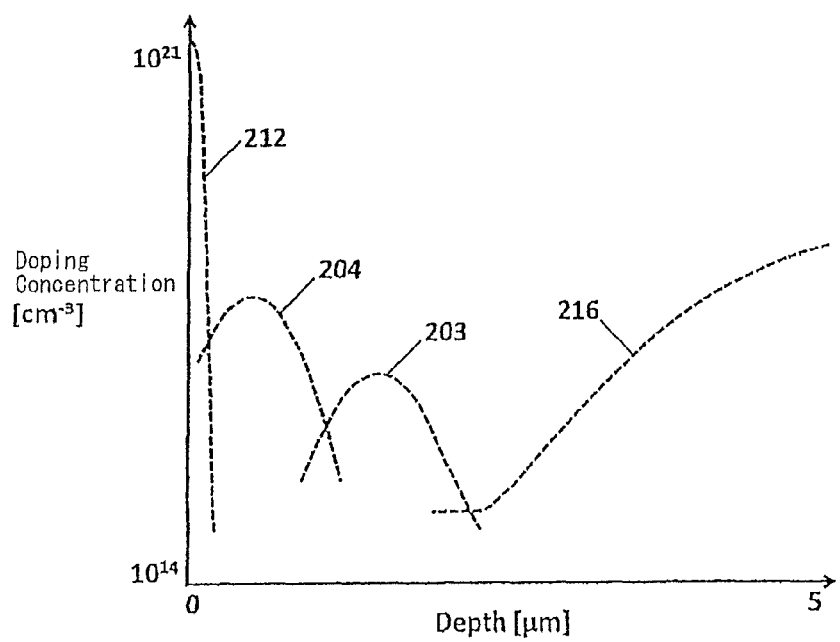
FIG. 8 illustrates a doping profile of the SPAD, in the depth direction, according to the fourth embodiment.

FIG. 8 illustrates an example of the doping profile of the SPAD according to the present embodiment. It is preferred that the substrate 201 be a p-type conductive material. Further, as illustrated in FIG. 8, it is preferred that an average doping concentration of a doping gradient 216 of the epitaxial layer 202 be higher than an average doping concentration of the epitaxial layer 202. The average doping concentration of the epitaxial layer 202 can be set to a value in the range from $10^{14}/cm^3$ to $10^{15}/cm^3$. It is preferred to set an average doping concentration of the substrate 201 to be higher than $10^{18}/cm^3$.

As discussed in US 2010/0159632 A1, there is a conventional method for manufacturing a backside illumination (BSI) type image sensor. According to this method, an advantageous effect can be obtained by forming an epitaxial layer on a highly doped substrate, which naturally induces a gradient profile in the doping of the epitaxial layer in present CMOS processes. According to the BSI configuration, photons are mostly absorbed on a back surface of the silicon substrate, more specifically at a residual portion of the epitaxial layer having been subjected to wafer thinning processing. The doping gradient promotes the separation of electron-hole pairs generated by the absorption of photons and causes minority carriers (e.g., electrons) to move toward a photodiode area. Therefore, the responsiveness of the photodiode can be improved.

According to the manufacturing method discussed in US 2010/0159632 A1, not only heat treatment readily applied to layers implanted near the front surface but also the natural upward diffusion of dopants in the epitaxial layer are utilized to form the doping gradient. As mentioned above, it is feasible to obtain the doping gradient 216 without requiring any additional processing steps. When the thermal treatment is applied to the layers implanted at the front surface, dopants of the highly doped substrate diffuse upward from the back surface to the front surface. The above-mentioned dopant diffusion occurs in a growth process of the epitaxial layer and a high-temperature ion implantation process, such as a p-well forming process. The above-mentioned heat treatment at the front surface side has a function of annealing and uniformly activating the dopants that form the gradient. Therefore, the addition of any process that increases the manufacturing time and the manufacturing costs is typically not required.

As described above, the doping gradient 216 can be naturally formed in the wafer processing of an ordinary CMOS process. Alternatively, the doping gradient 216 can be formed with an additional thermal treatment process without having a large influence on the ordinary heat treatment process. In particular, it is preferred to form the doping gradient 216 in the thermal treatment process included in an existing CMOS process dedicated to an image sensor and/or a high-voltage device.

The doping gradient in the epitaxial layer can increase the photon detection efficiency. When electrons are generated by the absorption of photons, the electric field formed by the doping gradient causes the generated electrons to move toward the depletion layer of the SPAD. Therefore, the photon detection efficiency can be increased. A photon having a long wavelength comparable to the near infrared region is absorbed at a deeper portion. Therefore, in the front-side illumination, the doping gradient in the epitaxial layer can enhance the effect of increasing the photon detection efficiency in the near infrared region.

Photons absorbed in the epitaxial layer 202 generate an electron-hole pair at a position typically below the bottom of the depletion area 208. The doping gradient in the epitaxial layer forms an electric field that causes electrons to move upward from the bottom of the epitaxial layer 202. When electrons drifting in the generated electric field reach the depletion layer, the electrons are multiplied while they repetitively cause impact ionizations within the avalanche multiplication area. The avalanche multiplication phenomenon stops when the SPAD bias voltage decreases towards the breakdown voltage by means of a quenching device. As a result, it is feasible to detect incident photons in a large region extending from the top of the depletion layer or its vicinity to the bottom of the epitaxial layer. The electrons generated when photons are absorbed in the region corresponding to the doping gradient 216 of the epitaxial layer 202 can move upward and reach the bottom of the depletion layer within $10^{-9}$ seconds. Therefore, it is feasible to realize a SPAD with high-timing response even when near infrared photons are detected. In the substrate 201, there is no electric field that causes carriers to move upwards, because the doping concentration is constant. The lifetime of carriers is short in the substrate 201 because the doping concentration is high. Accordingly, the probability that the avalanche will be induced by photon-generated or thermally-generated carriers in the substrate 201 is small.

Similar to other embodiments, it is not always necessary to provide some of the layers illustrated in FIG. 7. More specifically, removing the fourth semiconductor layer 212, the isolation layer 215, and the electrode 213 from the embodiment illustrated in FIG. 7 is possible if doing so does not functionally cause any interference with the doping gradient 216 of the epitaxial layer 202 and related advantageous characteristics.

The SPAD described in the above-mentioned embodiment can be applied to a chip staking or three-dimension integration technology. More specifically, after the wafer on which the SPAD is formed is thinned, it can be bonded to another wafer on which additional circuitry (such as signal processing circuits) is formed. The SPAD is usable in configurations where the SPAD is illuminated from the front surface side or from the back surface side, although it requires an appropriate wafer bonding technology, such as a through-silicon via technology or a micro-bump array technology. The chip staking, thinning, and wafer bonding for BSI or FSI do not have substantial influences on the structure and effects of the SPAD according to the above-mentioned embodiment.

Compared to a standard CMOS process, the CMOS process specialized for an image sensor and/or a high-voltage device includes a larger number of semiconductor processing layers. Semiconductor layers usable in the above-mentioned CMOS process and an appropriate combination of these layers can be used to implement the SPAD described in the above-mentioned embodiment. Further, although only the cross-sectional structure of the SPAD has been described in the above-mentioned embodiment, each photomask to be used in the manufacturing of the SPAD is not specifically limited in shape and size. For example, the SPAD shape can be a circle, an ellipse, a rectangle, a square, or any other irregular polygon when seen from the front surface side of an integrated circuit. It is desired that the second semiconductor layer 203 and the first semiconductor layer 204 have an appropriate corner configuration capable of preventing a breakdown from occurring at an edge thereof. To this end, it is desired that the curvature radius is not so small and the corner angle is not so acute.

Figure 9A:
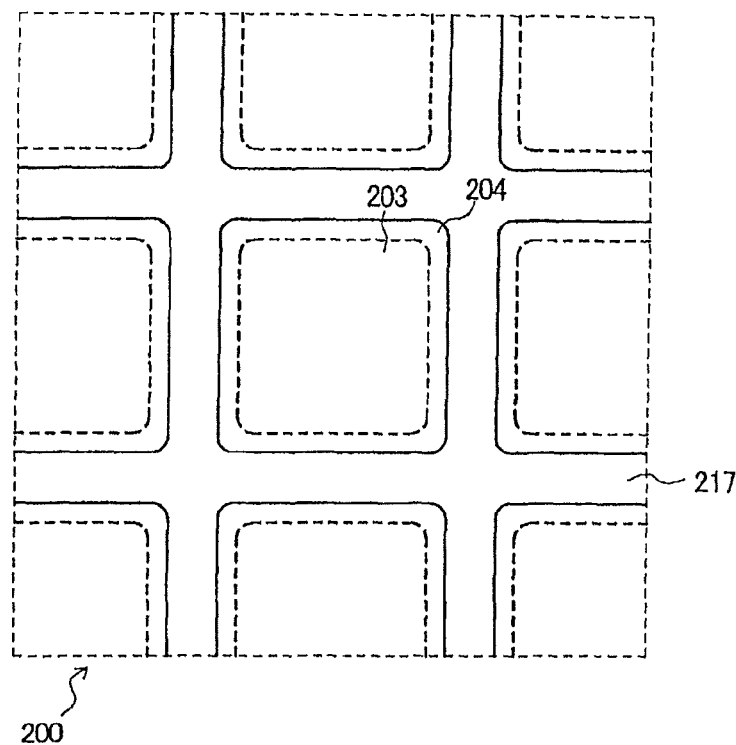
FIG. 9A illustrates a planar shape of the SPAD according to an embodiment of the present invention.

FIG. 9A illustrates a preferred shape applicable to the second semiconductor layer 203 and the first semiconductor layer 204. In FIG. 9A, both the second semiconductor layer 203 and the first semiconductor layer 204 have a square shape although it is rounded at each corner to maximize the fill factor of the SPAD array. In other words, a corner having an acute angle is avoided because curvature effects at the corner of the p-n junction can cause premature edge breakdown. It is preferred to design the curvature radius of each corner to be greater than the thickness 209 of the depletion layer, in consideration of the variability in photomask processing in the manufacturing process.

Figure 9B:
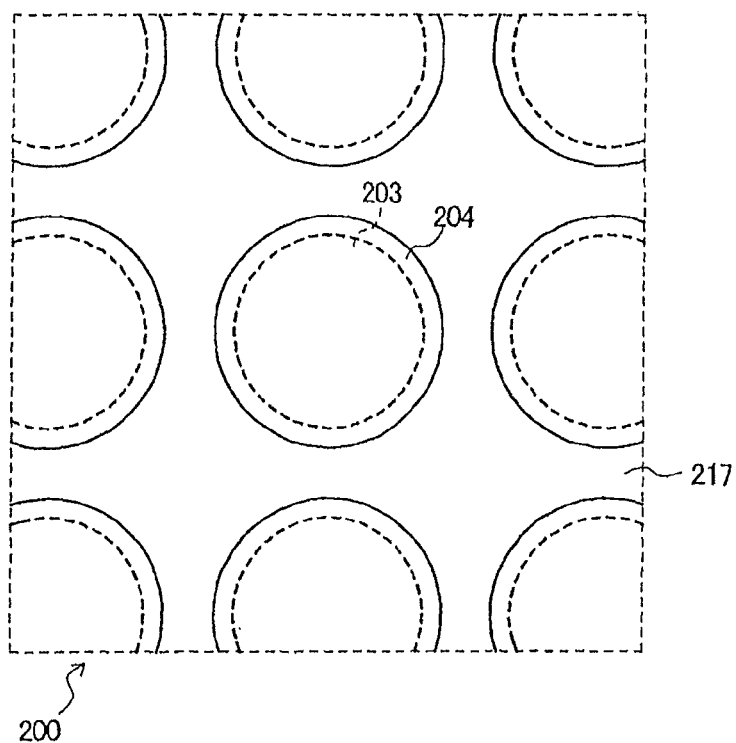
FIG. 9B illustrates a planar shape of the SPAD according to an embodiment of the present invention.
Figure 10:
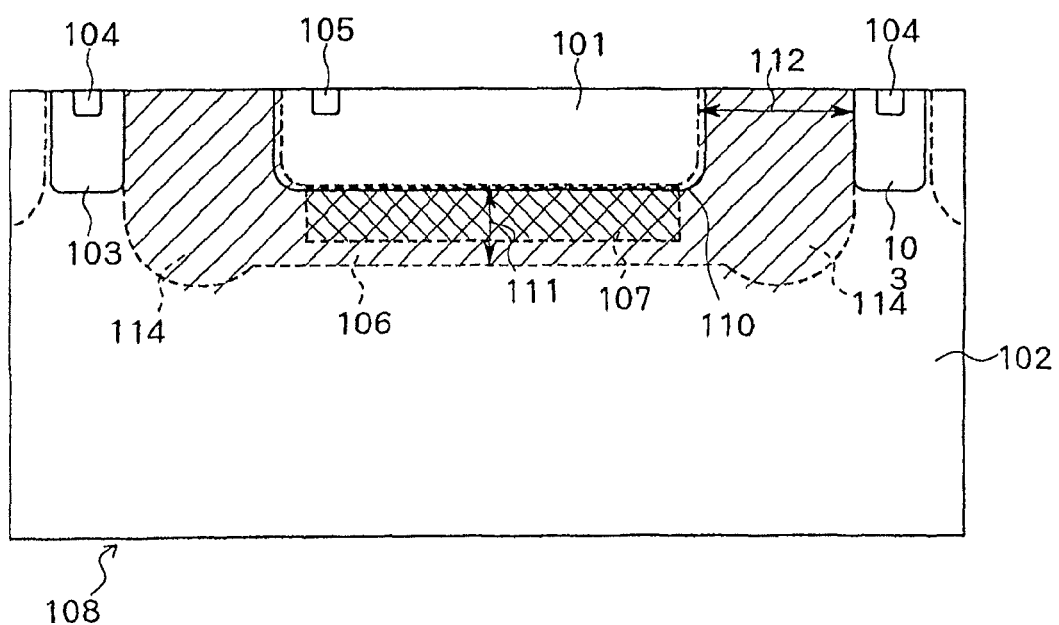
FIG. 10 is a cross-sectional view schematically illustrating a structure of a conventional SPAD.

FIG. 9B illustrates another desired shape of the SPAD. Both the second semiconductor layer 203 and the first semiconductor layer 204 have a circular shape to minimize the breakdown risk at a corner or an edge thereof. The aperture ratio of the SPAD configuration illustrated in FIG. 9B is smaller than the aperture ratio of the SPAD configuration illustrated in FIG. 9A. Therefore, the circular SPAD is employable when a smaller SPAD is required.

In FIGS. 9A and 9B, the layers employed in the above-mentioned embodiment are omitted. For example, the third semiconductor layer 205 and the separation layer 215 are generally disposed in an intervening area 217 between neighboring SPADs and can be formed to have an arbitrary shape. For example, the third semiconductor layer 205 and the isolation layer 215 can be configured to be complementary to the first semiconductor layer 204 or can be configured to maintain an appropriate distance between the first semiconductor layer 204 and the third semiconductor layer 205. If it is necessary to include a circuit within the boundary of a pixel, an n-type MOSFET can be directly provided in the third semiconductor layer 205. Further, if it is necessary to include a p-type MOSFET within the boundary of a pixel, it is feasible to form an n-type well in the third semiconductor layer 205 or in the intervening area 217 between neighboring SPADs and provide the p-type MOSFET inside the n-type well. The formed n-type well must be isolated from the first semiconductor layer 204 or the second semiconductor layer 203 (i.e., the n-type layer).

In the present embodiment, the technical term "carrier" means a charged particle in a semiconductor material, and is either an electron or a hole.

The technical term "array" means an array or an assembly that includes a plurality of SPADs or includes at least an element (e.g., pixel). The technical term "pixel" refers to one element included in an array of light-receiving devices, which can be constituted by a single or an arbitrary number of SPAD arrays. For example, one pixel may include several tens to several hundreds of SPADs.

In the foregoing description, quantitative explanations are intended to merely demonstrate some examples and are not limited to the values described in the embodiments.

The technical term "order" means an approximate value that can be taken by each parameter or each variable. For example, the parameters or the variables relating to the electric field or the doping concentration may take smaller values comparable to $1/10$, $1/100$, or $1/1000$ of the values described in the above-mentioned embodiments. To the contrary, the parameters or the variables may take larger values comparable to 10, 100, or 1000 times the described values. The technical term "long wavelength" means a wavelength longer than the central wavelength of a visible spectrum. Examples of a long wavelength signal include optical signals corresponding to wavelengths 635 nm and 700 nm of the visible light range and optical signals corresponding to wavelengths 850 nm and 900 nm of the near infrared region. The technical term "conductive path" means not only a path extending across a doped semiconductor material (regardless of whether or not it is configured as a depletion layer) but also a path partly including a resistor. The technical term "neighbor" means that a concerned position is desirably included in a target area or located in its vicinity. For example, the above definition can be applied to a diffusion area or an implantation area, according to which the boundary between the target area and other area is not clearly demarcated. Further, the technical term "neighbor" means a two-dimensional or three-dimensional area that is located within several nanometers or several micrometers from the target area.

The technical term "implanted layer" means a semiconductor layer that can be formed on a surface of a semiconductor material in a diffusion process or in an ion implantation process. Further, the technical term "buried layer" means a semiconductor layer that is formed at a deeper position spaced from the surface of the semiconductor material. In the CMOS process, a deep-well and a buried well are examples of the "buried layer." Each of the deep-well and the buried well has a profile in which the doping concentration is increased at a deeper position. These buried layers can be formed on a silicon wafer through a single or a plurality of ion implantation steps. In general, different process parameters (e.g., ion energy and ion implantation angle) are used in each ion implantation processing step.

What is claimed is:

1. A single photon avalanche diode (SPAD), comprising:
a first semiconductor layer of a first conductivity type;
a second semiconductor layer of a second conductivity type implanted under the first semiconductor layer, in which the second conductivity type is opposite to the first conductivity type;
a third semiconductor layer of the second conductivity type, which surrounds the first semiconductor layer;
an epitaxial layer of the second conductivity type, which is formed on a substrate,
a first contact connected to the first semiconductor layer via a conducting layer of the first conductivity type; and
a second contact connected to the second semiconductor layer via a conducting layer of the second conductivity type,
wherein the second semiconductor layer is buried in the epitaxial layer and the second semiconductor layer is fully depleted when a bias voltage is applied between the first contact and the second contact.

2. The SPAD according to claim 1, wherein the first semiconductor layer is of n-type conductivity, and the substrate, the epitaxial layer, the second semiconductor layer, and the third semiconductor layer are of p-type conductivity.

3. The SPAD according to claim 2, further comprising:
a fourth semiconductor layer of p-type conductivity formed in the first semiconductor layer, and
a third contact connected to the fourth semiconductor layer via the conducting layer of the first conductivity type.

4. The SPAD according to claim 3, wherein the first contact has an electric potential that is identical to that of the third contact.

5. The SPAD according to claim 3, wherein the third contact has a floating potential.

6. The SPAD according to claim 3, wherein a statically or dynamically modulated bias voltage is applied between the first contact and the third contact.

7. The SPAD according to claim 3, further comprising:
a buried isolation layer of the same conductivity type as the third semiconductor layer,
wherein the third semiconductor layer and the buried isolation layer are multilayered in a depth direction.

8. The SPAD according to claim 7, wherein a same photomask is used at least partially to form the buried isolation layer and the second semiconductor layer.

9. The SPAD according to claim 1, where the epitaxial layer has a doping gradient according to which a doping concentration becomes higher with an increasing distance from a surface of the epitaxial layer in a depth direction.

10. The SPAD according to claim 9, wherein the first semiconductor layer is of n-type conductivity, the second semiconductor layer is of p-type conductivity, and the third semiconductor layer is a p-well, the epitaxial layer is of p-type conductivity, and the substrate is of p-type conductivity.

11. The SPAD according to claim 3, where the epitaxial layer has a doping gradient according to which a doping concentration becomes higher with an increasing distance from a surface of the epitaxial layer in a depth direction.

12. The SPAD according to the claim 11, wherein the first semiconductor layer is of n-type conductivity, the second semiconductor layer is of p-type conductivity, and the third semiconductor layer is a p-well, the epitaxial layer is of p-type conductivity, and the substrate is of p-type conductivity.

13. The SPAD according to claim 3, wherein the first semiconductor layer is an n-well and the fourth semiconductor layer is a p+ layer.

14. The SPAD according to claim 1, wherein a breakdown voltage of a junction between a bottom portion of the first semiconductor layer and the second semiconductor layer is lower than a breakdown voltage of a junction between the first semiconductor layer and any region other than the second semiconductor layer.

15. The SPAD according to claim 3, wherein a breakdown voltage of a junction between a bottom portion of the first semiconductor layer and the second semiconductor layer is lower than a breakdown voltage of a junction between the first semiconductor layer and any region other than the second semiconductor layer.

16. The SPAD according to claim 1, wherein a width of a depletion layer in one lateral direction between the first semiconductor layer and the third semiconductor layer is smaller than a thickness of the depletion layer in a depth direction between the first semiconductor layer and the epitaxial layer.

17. The SPAD according to claim 3, wherein a width of a depletion layer in one lateral direction between the first semiconductor layer and the third semiconductor layer is smaller than a thickness of the depletion layer in a depth direction between the first semiconductor layer and the epitaxial layer.

18. An integrated circuit comprising an array pattern constituted by a plurality of SPADs, each of which has a configuration according to claim 1.

19. An integrated circuit comprising an array pattern constituted by a plurality of SPADs, each of which has a configuration according to claim 3.

* * * * *